(12) United States Patent
Wakimoto et al.

(10) Patent No.: US 7,262,100 B2
(45) Date of Patent: Aug. 28, 2007

(54) SEMICONDUCTOR DEVICE AND MANUFACTURING METHOD THEREOF

(75) Inventors: Setsuko Wakimoto, Nagano (JP); Manabu Takei, Nagano (JP); Shinji Fujikake, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 0 days.

(21) Appl. No.: 11/219,320

(22) Filed: Sep. 2, 2005

(65) Prior Publication Data
US 2006/0076583 A1  Apr. 13, 2006

(30) Foreign Application Priority Data

Sep. 2, 2004  (JP)  ............................. 2004-256251
Jun. 27, 2005  (JP)  ............................. 2005-185877

(51) Int. Cl.
*H01L 21/336* (2006.01)

(52) U.S. Cl. ................ 438/270; 438/133; 257/E21.382

(58) Field of Classification Search ................ 438/133, 438/137, 170, 202, 309, 268, 270; 257/273, 257/565, 591, 592
See application file for complete search history.

(56) References Cited

U.S. PATENT DOCUMENTS 6,472,722 B1 * 10/2002 Ho .............................. 257/630

FOREIGN PATENT DOCUMENTS

| JP | 8-316479 A | 11/1996 |
|---|---|---|
| JP | 2002-158356 A | 5/2002 |
| JP | 2002-208701 A | 7/2002 |
| JP | 2003-347549 A | 12/2003 |
| WO | WO 00/35021 A1 | 6/2000 |

OTHER PUBLICATIONS

Udrea, F. et al., "A unified analytical model for the carrier dynamics in Trench Insulated Gate Bipolar Transistors (TIGBT)"; Proceedings of 1995 International Symposium on Power Semiconductor Devices & ICs, Yokohama, pp. 190-195.
Omura, I. et al., "Carrier injection enhancement effect of high voltage MOS devices—Device physics and design concept," IEEE, 1997, pp. 217-220.

* cited by examiner

*Primary Examiner*—Quoc Hoang
(74) *Attorney, Agent, or Firm*—Rossi, Kimms & McDowell LLP

(57) ABSTRACT

A semiconductor device has a MOS gate side surface structure, including a gate electrode filling a trench formed in a semiconductor substrate with an insulator film between the trench and the gate electrode, a gate insulator film covering the surface of the gate electrode, a buffer region of one conductivity type in contact with the semiconductor substrate, a base region of the other conductivity type adjacent to the buffer region on the gate insulator film, and an emitter region of the one conductivity type adjacent to the base region on the side opposite to the buffer region. The semiconductor device and the method of manufacturing thereof can further improve the tradeoff between the on-voltage and the turn-off loss by increasing the amount of electrons injected from a cathode on the surface to increase an amount of carriers on the cathode side in a stable turned-on state of the device.

4 Claims, 13 Drawing Sheets

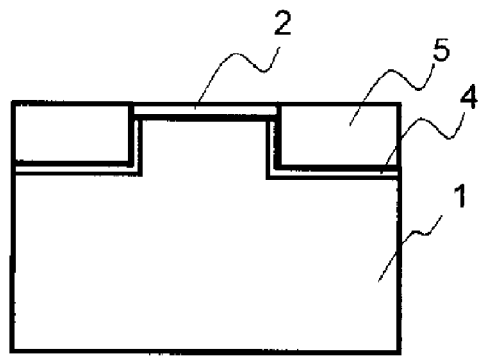
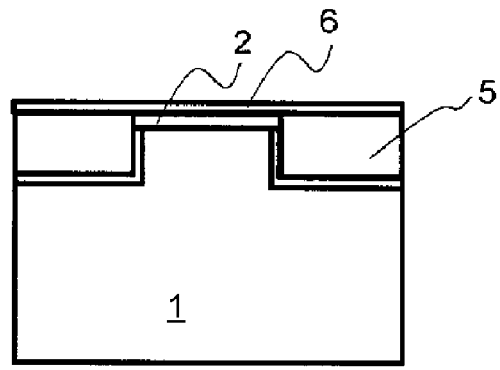
FIG. 2A
FIG. 2B
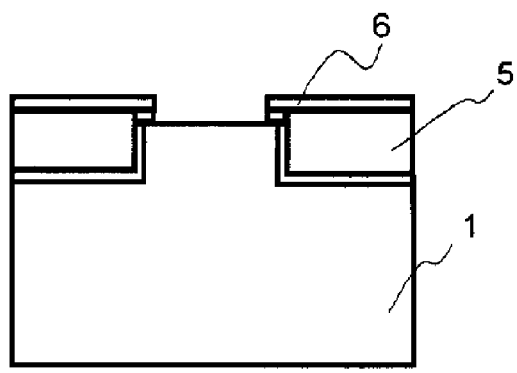
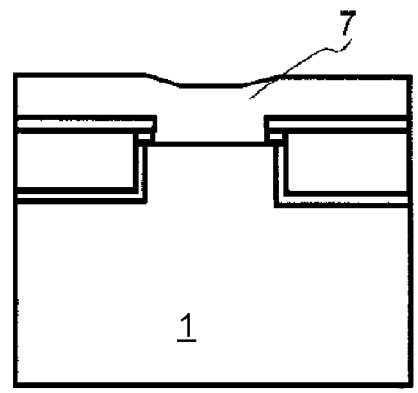
FIG. 2C
FIG. 2D

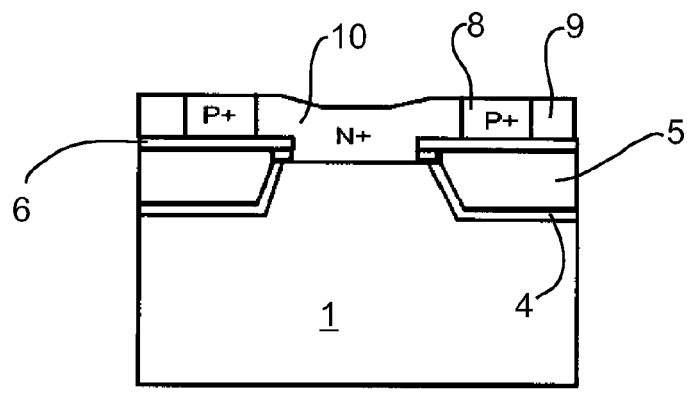
FIG. 6A
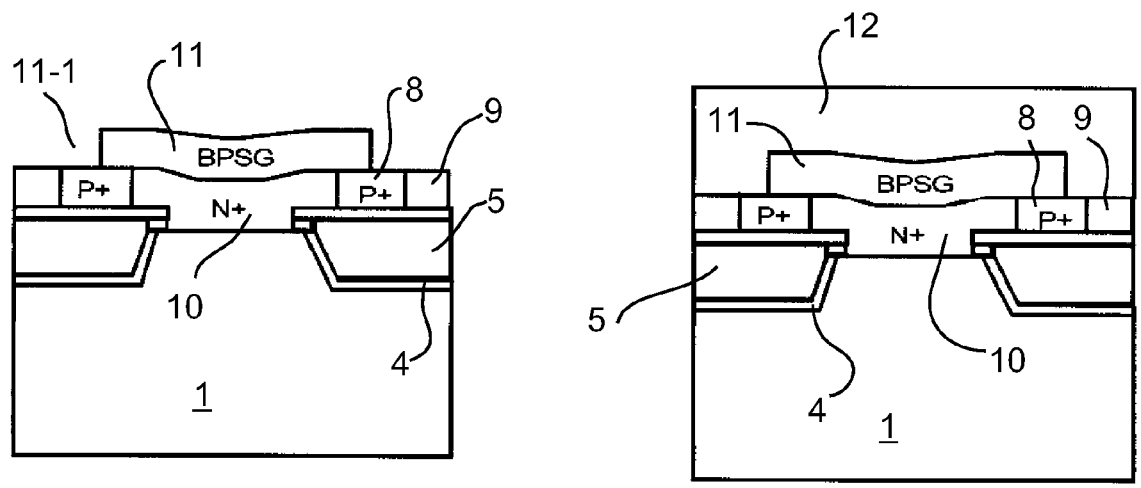
FIG. 6B
FIG. 6C

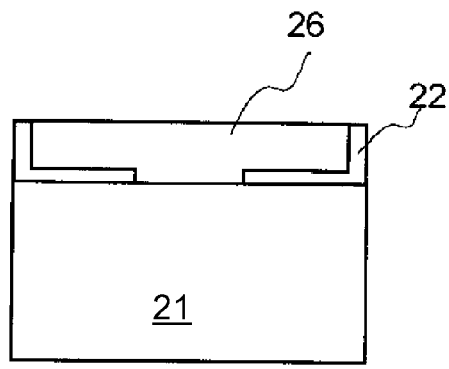
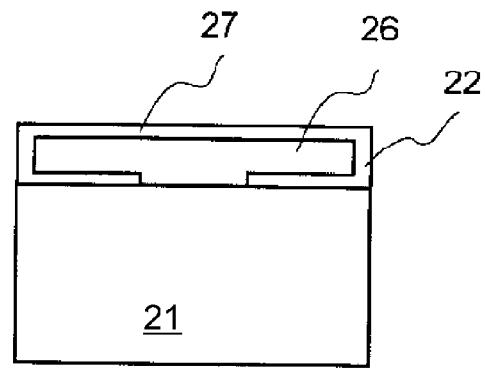
FIG. 8A          FIG. 8B
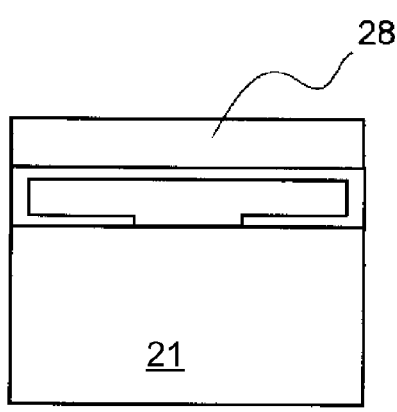
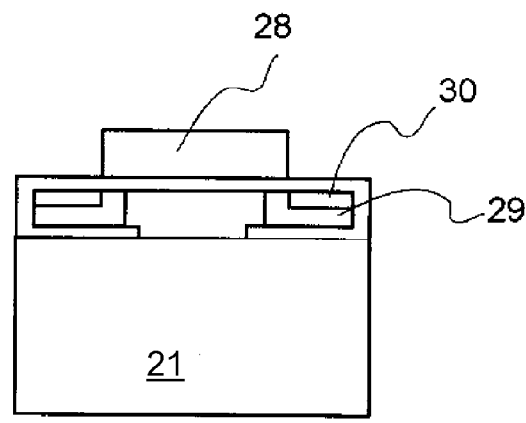
FIG. 8C          FIG. 8D

SEMICONDUCTOR DEVICE AND MANUFACTURING METHOD THEREOF

BACKGROUND

Efforts have been made to enhance performance of an IGBT by carrying out many improvements. Here, the performance of an IGBT is identified as a switch that completely cuts off current while holding an applied voltage when turned-off, and allows current to flow with the least possible voltage drop, i.e., with the least possible on-resistance for the least possible power loss when turned-on. For purposes of an operation an IGBT, a collector is typically expressed as an "anode" and an emitter is typically expressed as a "cathode."

There exists a tradeoff relationship between the maximum voltage that can be held by an IGBT, i.e., a magnitude of a breakdown voltage, and a voltage drop when the IGBT is turned-on, where an IGBT with a higher breakdown voltage has a higher on-voltage. Ultimately, the limit of the optimum value in the tradeoff relation is determined by physical properties of silicon. For enhancing the optimum value in the tradeoff, property/structural changes are needed to prevent a local electric field concentration buildup when an IGBT holds an applied voltage.

Another important measure representing performance of an IGBT is a tradeoff between an on-voltage and a switching loss (in particular, a turn-off loss). An IGBT, being a switching device, carries out an operation from being turned-on to being turned-off, or from being turned-off to being turned-on. At an instant of such a switching operation, a large loss is produced per unit time. In general, an IGBT with a lower on-voltage is turned-off more slowly and produces a larger turn-off loss. Making the turn-off loss smaller causes the on-voltage to become high. This is referred to as a relation that necessitates a tradeoff. By improving such a tradeoff, performance of an IGBT can be enhanced. Note that a turn-on loss of an IGBT has a little dependence on the on-voltage, but rather largely depends on the characteristics of the free-wheeling diode used in combination with the IGBT.

For optimizing the tradeoff between the on-voltage and the turn-off loss, it is effective to optimize a distribution of excessive carriers in an IGBT in a turned-on state. For lowering the on-voltage, the amount of excessive carriers can be increased to lower the resistance value of a drift layer. At the turning-off state, however, all of the excessive carriers must be swept out from the device or made to disappear by an electron-hole recombination. A large amount of excessive carriers increases the turn-off loss. Therefore, for optimizing such a tradeoff, it is necessary to minimize the distribution of excessive carriers that causes the turn-off loss by the same lowered on-voltage.

For achieve the optimum tradeoff, it is necessary to lower the carrier concentration on the anode side while increasing the carrier concentration on the cathode side to thereby provide a ratio of the carrier concentration on the anode side to the carrier concentration on the cathode side to about 1:5. Furthermore, it is also necessary to hold the carrier lifetime in the drift layer longest possible so that an averaged carrier concentration in the drift layer is made high.

When an IGBT is turned-off, the depletion layer expands from the p-n junction on the cathode side to the inside of the drift layer with progress toward the anode layer on the bottom surface. At this time, of excessive carriers in the drift layer, holes are drawn out by an electric field from the end of the depletion layer. This creates an electron excessive state, where the excess of electrons are injected into the anode layer in a p-type through a neutral region. Thus, the p-n junction on the anode side is slightly forward-biased, which causes reverse injection of holes with the amount depending on the amount of the injected electrons. The holes brought by the reverse injection merge with holes drawn out by the above-explained electric field and enter the depletion layer.

Carriers (here, holes) carrying electric charges pass through the region of the electric field toward the cathode side. Thus, work is to be done in the electric field on the carriers. The work done on the carriers in the electric field eventually causes lattice vibration of crystal lattices, such as those of silicon, due to collisions of carriers with the crystal lattices, and is dissipated as heat. The dissipated energy becomes the turn-off loss. Note that the energy dissipated due to the carriers drawn out before the depletion layer has extended out is smaller than the energy dissipated due to the carriers being drawn out when the depletion layer has extended out. This is because the depletion layer before having extended out provides a small potential difference when the carriers pass through the depletion layer, by which small work is done in the depletion layer on the carriers in the electric field.

The above explanation is made from the microscopic viewpoint. From the macroscopic view point of the terminal voltage of a device, it means that current flowing before the anode-cathode voltage has finished rising, i.e., flowing while the anode-cathode voltage is rising, makes a smaller contribution to the loss expressed by the product of the voltage and the current (voltage×current) than the current flowing after the anode-cathode voltage has finished rising. From the foregoing, it is known that a carrier distribution deviating to the cathode side by the later-described IE effect causes a smaller turn-off loss than the carrier distribution deviating to the anode side under conditions that a fraction of carriers drawn out under a low voltage is larger and on-voltages to both the distributions are the same.

The carrier concentration on the anode side can be reduced by reducing the total amounts of impurity concentrations in the anode layer. This is not so difficult in itself. However, in an IGBT with a low rated breakdown voltage, such as 600V, for reducing the total amounts of impurity concentrations in the anode layer, the thickness of the wafer must be brought to on the order of 100 µm or below. Because such a thin wafer must be handled during the manufacturing process, the manufacturing technique becomes complicated and difficult. Also, the carrier concentration on the cathode side is increased due to the IE effect.

For a cathode structure with a large IE effect, a structure such as the HiGT structure is proposed in which an n-layer with a high impurity concentration is inserted in a cathode so as to surround a p-base of a planar structure (see JP-A-2003-347549 and JP-T-2002-532885, for example). Moreover, in a trench gate structure, structures such as a CSTBT structure, in which an n-layer having a higher impurity concentration than a drift layer is inserted in a mesa section between the adjacent trenches, and an IEGT (Injection Enhancement Gate Transistor) structure (see JP-A-8-316479, and Omura, et al, "Carrier injection enhancement effect of high voltage MOS devices—Device physics and design concept—", ISPSD '97, pp. 217-220, for example), have been proposed. In general, the IE effect in the trench structure is larger than that in the planar structure.

The IE effect is discussed and reported in Udrea, et al, "A unified analytical model for the carrier dynamics in Trench Insulated Gate Bipolar Transistor (TIGBT)," ISPSD '95, pp.

190-195, for example. An often drawn equivalent circuit of an IGBT is a combination of a MOSFET (Insulated Gate Field Effect Transistor having a Metal-Oxide-Semiconductor structure) and a bipolar transistor. However, with an actual device operation taken into consideration, the equivalent circuit can be regarded, as an equivalent circuit shown in present FIG. 13, which is a combination of a MOSFET 51, a p-n-p bipolar transistor 52, and a p-i-n diode 53 (also disclosed in a co-pending application Ser. No. 11/219,308 filed concurrently herewith).

FIG. 14 schematically illustrates a cross sectional view showing an arrangement of a principal part of a planar IGBT. In FIG. 14, the right region 54 identified in dashed lines denotes a p-n-p bipolar transistor region (hereinafter referred to as a p-n-p BJT region) and the left region 55 identified in dashed lines denotes a p-i-n diode region. Moreover, in FIG. 14, the arrows in solid lines represent flow of electron current, while the arrows in dotted lines represent flow of hole current. In the present disclosure, the leading character "n" or "p" preceding the names of the layers and regions means that the majority carriers in the layers and the regions are electrons or holes, respectively. Moreover, a region (including a layer) named with a leading character "$n^+$" or "$p^+$" means that the region (including the layer) has a higher impurity concentration than the region (including the layer) named with the leading character "n" or "p" without the sign "+", respectively. Furthermore, a region (including a layer) named with a leading character "$n^{++}$" means that the region (including the layer) has a higher impurity concentration than the region (including the layer) named with the leading character "$n^+$".

As shown in FIG. 14, electrons flow from an $n^{++}$-region 56 on the surface of a MOS section to a p-anode layer 61 on the bottom surface through an $n^+$-inversion layer 58 on a p-layer 57 surrounding the $n^{++}$-region 56 and an $n^+$-electron accumulation layer 60 on the surface of an $n^-$-drift layer 59. Part of the electron current becomes a base current of the p-n-p BJT region 54. In the p-n-p BJT region 54, holes coming from the p-anode layer 61 by diffusion or drift are only collected in the p-layer 57, and the p-n junction between the p-layer 57 and the $n^-$-drift layer 59 is slightly reverse-biased. Therefore, the concentration of minority carriers, i.e., holes in the $n^-$-drift layer 59 near the p-n junction is extremely low.

The n-cathode in the p-i-n diode region 55 is the $n^+$-electron accumulation layer 60 on the surface of the $n^-$-drift layer 59. Since the junction between the $n^+$-electron accumulation layer 60 and the $n^-$-drift layer 59 (hereinafter abbreviated as the $n^+/n^-$-junction) is slightly forward-biased, electrons are injected into the $n^-$-drift layer 59. When large current flows, an electron concentration becomes far higher than the doping concentration in the $n^-$-drift layer 59 (a high-injection state). Moreover, for satisfying the charge neutrality condition, there exist holes with the same concentration as that of electrons. Therefore, the concentration of minority carriers, i.e., holes, in the $n^-$-drift layer 59 near the $n^+/n^-$ junction is extremely high.

For achieving the optimum carrier distribution with a deviation to the cathode side in an IGBT, it is important to reduce the p-n-p BJT region 54 and to increase a p-i-n diode region 55. Moreover, it is very important to increase the amount of forward bias across the $n^+/n^-$ junction to enhance electron injection. In every previously proposed structure having the IE effect, proportion of the p-i-n diode region is increased while attaining an increase in an amount of forward bias across the $n^+/n^-$ junction.

Note that in an IGBT with a planar structure, reduction in proportion of a region occupied by a p-base in a cell pitch reduces an on-voltage. The reason for this is due to the increase in the proportion of the p-i-n diode region with an additional rise in a lateral current density near the surface that caused an increase in a voltage drop, which enhances the effect of increasing the forward bias across the $n^+/n^-$ junction. From a different view point, the reason for increasing the forward bias across the $n^+/n^-$ junction can be also said that the electric potential of the $n^+$-layer, having low resistance, is equal to the cathode electric potential, while the electric potential of the $n^-$-layer, having high resistance, is raised by the voltage drop due to the large current.

In the same way, in an IGBT with a trench structure, by reducing proportion of the p-n-p BJT region, the IE effect can be enhanced. Reduction in proportion of the p-n-p BJT region can be made by bringing the p-base region to a floating state in a mesa section, for example. Moreover, the IE effect can be also enhanced by making the trench deeper to isolate the bottom of the trench from the p-n junction. Furthermore, by narrowing the width of the mesa section, the IE effect also can be enhanced. This, in both cases, is considered to be due to the increase in the hole current flowing in the mesa section that increases the forward bias across the $n^+/n^-$ junction due to a voltage drop.

Here, letting Nd be the doping concentration in the drift layer and Vn be the forward bias applied across the $n^+/n^-$ junction, the electron density n on the $n^-$-layer side of the $n^+/n^-$ junction can be expressed by the following expression, where k is Boltzmann constant and T is an absolute temperature:

$$n = Nd * \exp(Vn/kT).$$

As is apparent from the above expression, depending on the forward bias applied to the $n^+/n^-$ junction, the electron density on the cathode side is exponentially increased. To increase the amount of the forward bias, a voltage drop caused by a large current can be used. Moreover, as are described in JP-A-2003-347549, JP-T-2002-532885 and JP-A-8-316479, the amount of the forward bias can be increased by also increasing the n-type impurity concentration in the $n^+$-layer. However, the HiGT structure described in JP-A-2003-347549, being a planar structure, causes a large reduction in the forward breakdown voltage when the n-type impurity concentration in the $n^+$ buffer layer on the surface side is excessively high.

In the CSTBT structure described in JP-A-8-316479, the $n^+$-buffer layer on the surface side is held between the trench gate oxide films with its electric potential continuing to the electric potential of the polysilicon through the gate oxide film. This depletes the $n^+$-buffer layer on the surface side not only from the p-n junction but also from the boundaries of the trench gate oxide films on both sides. Thus, the $n^+$-buffer layer on the surface side is completely depleted with a low forward bias. Therefore, although the $n^+$-buffer layer on the surface side has a high impurity concentration, the electric field strength inside the layer is reduced. Even though the forward bias is further increased, the reduced electric field strength in the mesa section between the trenches hardly makes a local peak in the electric field.

This holds true to the principle of the MOSFET with a superjunction structure that includes in a drift section, instead of including a drift layer formed with a uniform layer of a single conductivity type, a parallel p-n structure in which vertical-layer-like n-type regions, each with an increased impurity concentration, and vertical-layer-like p-type regions are alternately joined. Thus, the CSTBT structure has such characteristics that enhance the IE effect and yet make it hard to lower the forward breakdown voltage. The $n^+$-buffer layer on the surface side causes, between the $n^-$-drift layer, a diffusion potential that becomes a potential barrier for holes. Thus, the hole concentration in the drift layer is increased (the first explanation).

As another explanation (the second explanation) for the reason, it can be said that the $n^+$-buffer layer on the surface side and the $n^-$-drift layer being forward-biased causes electrons to be injected from the $n^+$-buffer layer. Namely, in the $n^+/n^-$ junction, the $n^+$-layer with a high impurity concentration increases the electron injection efficiency, which increases the fraction of an electron current injected into the $n^-$-layer to hole current flowing in the $n^+$-layer. For allowing holes to flow in the $n^+$-layer by diffusion as minority carriers, the $n^+/n^-$ junction must be forward-biased. Since the higher the impurity concentration in the $n^+$-layer is, the smaller the concentration of holes as minority carriers in a thermal equilibrium state becomes, a higher amount of a forward bias becomes necessary for still allowing the same amount of hole current to flow with the impurity concentration in the $n^+$-layer made higher. Since a higher forward voltage increases an electron current flowing into the $n^-$-layer, an electron concentration is increased. The second explanation expresses the previous first explanation physically in different words. As explained above, it is known that, even in a related IGBT, such an element structure that deviates the carrier distribution to the cathode side due to the IE effect, is preferably provided for optimizing the on-voltage to turn-off loss tradeoff.

However, the above-explained optimization of the on-voltage to turn-off loss tradeoff cannot always be said to be sufficient. It is considered that the carrier density on the cathode side in the on-state must be further increased. Namely, it is not considered yet that the IE effect is sufficiently exhibited in such a MOS gate semiconductor device as a related IGBT, for example. For example, even in a device to which a trench gate structure is adopted as in the above-explained CSTBT structure or IEGT structure, although the tradeoff characteristic is improved better than that in a previous device, there are still possibilities for improvement by further miniaturization.

Meanwhile, the manufacturing process of a semiconductor device with the trench gate structure, although the manufactured trench gate structure exhibits a certain effect of improving the tradeoff as explained above, is longer and more complicated as compared with the manufacturing process of a semiconductor device with the planar structure. Thus, the rate of acceptable products of a semiconductor device with the trench gate structure is lower than the rate of acceptable products of a semiconductor device with the planar structure, which is liable to increase the product cost of the semiconductor device with the trench gate structure relatively higher than that of the semiconductor device with the planer structure.

In addition, further miniaturization of the semiconductor device with the trench gate structure regardless of the enhancing characteristics of the semiconductor device will result in a higher manufacturing cost. Therefore, even though the miniaturization is not carried out to the ultimate end, or even with a MOS gate semiconductor device without the trench gate structure, to improve the above-explained tradeoff is preferable from the view point of the rate of acceptable products and the view point of the product cost. In the semiconductor device with the trench gate structure, an electric field concentration is liable to occur particularly at the bottom of the trench, to easily cause a breakdown in dielectric strength or avalanche breakdown, which is liable to degrade the on-voltage to breakdown voltage tradeoff. Moreover, the structure has a problem in that, when the electric potential of the gate is made negative to that of the cathode, the electric field strength at the bottom of the trench increases to further degrade the breakdown voltage.

Accordingly, there remains a need to solve the above problems and provide a semiconductor device and a method of manufacturing the device with further improved performance, namely providing a semiconductor device capable of further improving the tradeoff between the on-voltage and the turn-off loss. The present invention addresses this need.

SUMMARY OF THE INVENTION

The present invention relates to a semiconductor device and a manufacturing method thereof, and particularly to a power semiconductor device forming an IGBT (Insulated Gate Bipolar Transistor) and a manufacturing method thereof.

One aspect of the present invention is a semiconductor device having a MOS gate side surface structure. The device can include a semiconductor substrate of one conductivity type, a trench, a polycrystalline semiconductor gate electrode region, a substrate insulator film, a gate insulator film, a deposited semiconductor layer, an interlayer insulator film, and an emitter electrode.

The trench is selectively formed into the semiconductor substrate. The trench can have a side wall forming an angle of 90° or less with the surface of the semiconductor substrate.

The polycrystalline semiconductor gate electrode region fills the trench. The substrate insulator film is positioned between the trench and the polycrystalline semiconductor gate electrode region. The gate insulator film covers the surface of the polycrystalline semiconductor gate electrode region.

The deposited semiconductor layer is in contact with the gate insulator film in a region on the trench and in contact with the surface of the semiconductor substrate in a region other than the region on the trench. The deposited semiconductor layer has a buffer region of the one conductivity type in contact with the surface of the semiconductor substrate, a base region of the other conductivity type adjacent to the buffer region on the gate insulator film, and an emitter region of the one conductivity type adjacent to the base region on the gate insulator film on the side opposite to the buffer region.

The interlayer insulator film covers the buffer region. The emitter electrode covers the interlayer insulator film and is in contact with both the base region and the emitter region on the side opposite to the side in contact with the gate insulator film.

In an alternative embodiment, the semiconductor device can include a semiconductor substrate of one conductivity type, a substrate insulator film, a deposited semiconductor layer, a gate electrode, a gate insulator film, an interlayer insulator film, and an emitter electrode.

The substrate insulator film is selectively formed on the surface of the semiconductor substrate, and the deposited semiconductor layer formed on the surface of the semiconductor substrate and the substrate insulator film. The deposited semiconductor layer has a buffer region of the one conductivity type in contact with the surface of the semiconductor substrate, a base region of the other conductivity type adjacent to the buffer region on the substrate insulator film, and an emitter region of the one conductivity type in the base region. The emitter region is at a position holding the surface of the base region between the buffer region and the emitter region.

The gate electrode can be of polycrystalline semiconductor on the surface of the buffer region and on the surface of the base region held between the buffer region and the emitter region. The gate insulator film can be held between the gate electrode and the buffer region, and between the gate electrode and the base region. The interlayer insulator film can cover the gate electrode of the polycrystalline semiconductor, and the emitter electrode can be in contact with both the base region and the emitter region.

In the above embodiments, the buffer region can have an impurity concentration higher than that of the semiconductor substrate, and the deposited semiconductor layer can be a single or polycrystalline semiconductor layer of the one conductivity type.

Another aspect of the present invention is a method of manufacturing the semiconductor having the trench set forth above, the method can include forming a masking insulator film on the surface of the semiconductor substrate, forming the trench in the semiconductor substrate using the masking insulator film as a mask, forming the substrate insulator film on the surface of the semiconductor substrate, including the trench, depositing a polycrystalline semiconductor layer to a thickness more than the depth of the trench, smoothing the surface of the polycrystalline semiconductor layer by grinding the surface of the polycrystalline semiconductor layer until the surface of the masking insulator film or the substrate insulator film becomes exposed, forming the gate insulator film on the surface of the semiconductor substrate, removing all of the insulator films layered at the position of the masking insulator film to expose the surface of the semiconductor substrate, depositing a semiconductor layer of the one conductivity type on the exposed semiconductor substrate and the gate insulator film so that the semiconductor layer contacts the surface of the exposed semiconductor substrate, forming the base region of the other conductivity type and the emitter region of the one conductivity type in the deposited semiconductor layer, the base region being formed adjacent to a region of the deposited semiconductor layer in contact with the semiconductor substrate, the region being provided as a buffer region of the one conductivity type, and the emitter region being formed adjacent to the base region on the side opposite to the buffer region, and forming the emitter electrode covering the buffer region with an interlayer insulator film between and in contact with both the base region of the other conductivity type and the emitter region.

Alternatively, the method of manufacturing the semiconductor device can include forming the substrate insulator film selectively covering the surface of the semiconductor substrate of one conductivity type, depositing the polycrystalline semiconductor layer, removing part of the polycrystalline semiconductor layer in contact with the surface of the semiconductor substrate, forming the gate insulator film, exposing the surface of the semiconductor substrate by removing part of the gate insulator film in contact with the surface of the semiconductor substrate, depositing the semiconductor layer of the one conductivity type on the exposed surface of the semiconductor substrate, forming in the semiconductor layer the base region of the other conductivity type adjacent to a buffer region of the one conductivity type as a region of the semiconductor layer in contact with the semiconductor substrate, and the emitter region of the one conductivity type adjacent to the base region on the side opposite to the buffer region, and forming the emitter electrode covering the buffer region with an interlayer insulator film between and in contact with both the base region and the emitter region.

BRIEF DESCRIPTION OF THE DRAWINGS

FIG. 2A schematically illustrates a cross sectional view showing the principal part of the semiconductor substrate at the manufacturing step next to the step shown in FIG. 1D at which the surface of the polysilicon layer is polished to be flat.

FIG. 2B schematically illustrates a cross sectional view showing the principal part of the semiconductor substrate at the manufacturing step next to the step shown in FIG. 2A at which a gate oxide film is formed on the surface of the masking oxide film and the polysilicon layer.

FIG. 2C schematically illustrates a cross sectional view showing the principal part of the semiconductor substrate at the manufacturing step next to the step shown in FIG. 2B at which oxide films are partly removed to expose the silicon substrate.

FIG. 2D schematically illustrates a cross sectional view showing the principal part of the semiconductor substrate at the manufacturing step next to the step shown in FIG. 2C at which a doped polysilicon layer is formed on the substrate.

FIG. 6A schematically illustrates a cross sectional view showing the principal part of the semiconductor substrate at the manufacturing step next to the step shown in FIG. 5D at which a source region, a base region, and a buffer region are formed in the doped polysilicon layer.

FIG. 6B schematically illustrates a cross sectional view showing the principal part of the semiconductor substrate at the manufacturing step next to the step shown in FIG. 6A at which a BPSG film as an interlayer insulator film is deposited and a contact hole is provided therein.

FIG. 6C schematically illustrates a cross sectional view showing the principal part of the semiconductor substrate at the manufacturing step next to the step shown in FIG. 6B at which an emitter electrode is formed to form a surface structure on the MOS gate side of an IGBT.

FIG. 8A schematically illustrates a cross sectional view showing the principal part of the semiconductor substrate at the manufacturing step next to the step shown in FIG. 7D at which the surface of the silicon epitaxial layer is polished to be flat.

FIG. 8B schematically illustrates a cross sectional view showing the principal part of the semiconductor substrate at the manufacturing step next to the step shown in FIG. 8A at which a gate oxide film is formed over the entire surface.

FIG. 8C schematically illustrates a cross sectional view showing the principal part of the semiconductor substrate at the manufacturing step next to the step shown in FIG. 8B at which a polysilicon layer to be a gate electrode is formed on the entire surface.

FIG. 8D schematically illustrates a cross sectional view showing the principal part of the semiconductor substrate at the manufacturing step next to the step shown in FIG. 8C at which the polysilicon layer is partially removed to form a p-channel region and an $n^{++}$-source region in the silicon epitaxial layer.

DETAILED DESCRIPTION

Detailed explanations of the present semiconductor device and method of manufacturing thereof is made with respect to specific examples. The present invention, however, is not to be limited to these specific examples.

Figure 1A:
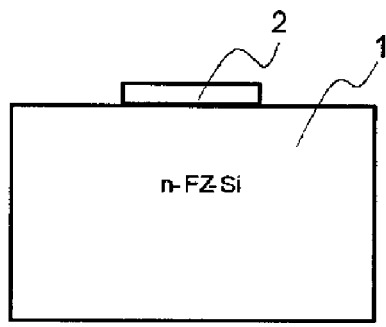
FIG. 1A schematically illustrates a cross sectional view showing a principal part of a semiconductor substrate at the manufacturing step at which a masking oxide film is formed on a silicon substrate in one manufacturing method of an IGBT according to the present invention.

FIG. 1A to FIG. 3C illustrate cross sectional views each showing a principal part of a semiconductor substrate at each of main manufacturing steps of one manufacturing method of a first embodiment of an IGBT with a surface cathode side high injection structure. As shown in FIG. 1A, on a mirror-polished surface of an n-type FZ-silicon substrate 1, an oxide film 2 is selectively formed. The resistivity of the substrate is preferably within a range of the order of 30 to 200 Ωcm, which is selected depending of the breakdown voltage of the IGBT. For example, manufacture by using a substrate with a resistivity of 80 Ωcm allows an IGBT with a breakdown voltage of 1200V to be provided. In the method of forming the selective oxide film 2, an oxide film is first formed on the entire surface of the silicon substrate 1 by thermal diffusion or CVD growth, specified patterning is then carried out on the film and the patterned oxide film is selectively subjected to dry etching. The thickness of the oxide film 2 (hereinafter, when distinction from other oxide films is necessary, referred to as the masking oxide film), can be one that is sufficiently resistant to subsequent trench etching and to further subsequent chemical mechanical polishing (hereinafter abbreviated as CMP). The thickness is preferably within a range of the order of 0.1 to 0.8 µm. In the present example, the film thickness of the masking oxide film 2 was taken as 0.3 µm.

Figure 1B:
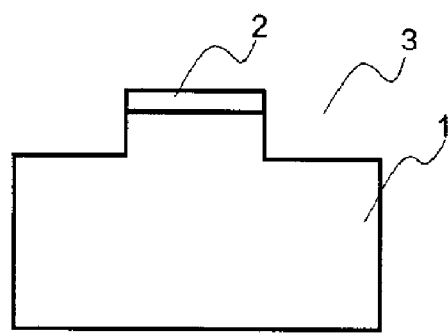
FIG. 1B schematically illustrates a cross sectional view showing the principal part of the semiconductor substrate at the manufacturing step next to the step shown in FIG. 1A at which a trench is formed in the substrate.

Next, as shown in FIG. 1B, a trench 3 is formed with the selective oxide film 2 used as a mask. The depth of the trench 3 is desirably within a range of 0.3 to 1 µm. In the example, the depth of the trench 3 was determined as 0.7 µm. The width left between the trenches 3 and the cell pitch are preferably within the range of 1 to 5 µm and the range of 5 to 20 µm, respectively. In the first example, the width left between the trenches 3 and the cell pitch are taken as 3 µm and 10 µm, respectively. Thus, the width of the trench 3 becomes 7 µm. The side wall angle of the formed trench 3 (the angle formed by the surface of the substrate and the side wall) is 90° in this example. The method of forming the trench 3 is given as anisotropic dry etching using plasma RIE (Reactive Ion Etching) of an ICP (Inductively Coupled Plasma) system. In the example 1, the conditions for the etching were given as: the flow rate of $SF_6$=40 sccm, the flow rate of HBr=40 sccm, the flow rate of $O_2$=60 sccm, the pressure=3.3 Pa, the plasma source power=400 W, the bias power=100 W and the etching time=20 sec. However, the etching condition is not limited to the above on condition that the desired cross sectional shape is obtained.

Figure 1C:
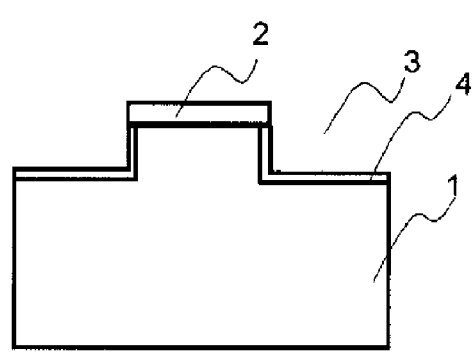
FIG. 1C schematically illustrates a cross sectional view showing the principal part of the semiconductor substrate at the manufacturing step next to the step shown in FIG. 1B at which a substrate oxide film is formed on the inner surface of the trench.
Figure 1D:
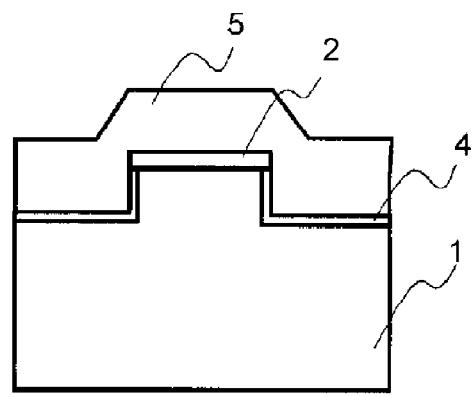
FIG. 1D schematically illustrates a cross sectional view showing the principal part of the semiconductor substrate at the manufacturing step next to the step shown in FIG. 1C at which a polysilicon layer is deposited to fill the trench.

Subsequently, as shown in FIG. 1C and FIG. 1D, a thermal oxide film (hereinafter to be referred to as a substrate oxide film when distinction from other oxide films is necessary) 4 is formed on the inner surface of the trench 3 by carrying out thermal oxidation, and a polysilicon layer 5 is thereafter deposited to a thickness greater than that for filling the trench 3. The thickness of the substrate oxide film 4 formed on the inner surface of the trench 3 is desirably within the range of the order of 0.08 to 0.2 µm. In this example, the substrate oxide film 4 with a thickness of 0.1 µm was formed. The polysilicon layer 5 is preferably deposited to a thickness above the upper end of the masking oxide film 2. In this example, the thickness of the polysilicon layer 5 was given as 1.2 µm.

Thereafter, an uneven surface of the polysilicon layer 5 is polished by CMP to be a flat face as shown in FIG. 2A with the masking oxide film 2 used as a stopper (a polishing termination detecting film). For the CMP, the high purity colloidal silica slurry planerlite-6103 made by Fujimi Inc. was used with typical polishing conditions of 300 to 600 hP in top ring pressure and 50 to 100 rpm in number of table revolution. Since a common polishing rate of the polysilicon layer 5 is 1 to 2 µm/minute, a common polishing rate of the oxide film is 10 to 20 nm/minute and the polishing selectivity ratio of the two is 100 under the conditions, the masking oxide film 2 can be used as a polishing termination detecting film. With a known polishing rate and a known film thickness to be polished, a polishing time can be derived. In this example, the manufacturing steps are carried out under the above conditions. The manufacturing steps, however, can be carried out without being limited to the above conditions as far as a flat face as shown in FIG. 2A is obtained.

Next, as shown in FIG. 2B, a gate oxide film 6 is formed by a thermal oxidation method on the surface of the semiconductor substrate in which the previously described manufacturing steps have been completed. The thickness of the gate oxide film 6 is desirably within the range of the order of 0.05 to 0.15 µm. In this example, the thickness was given as 0.1 µm. Thereafter, as shown in FIG. 2C, patterning is carried out to leave the gate oxide film 6 so that the film 6 covers the surface section of the polysilicon layer 5 and to remove the oxide films 2 and 6 between the trenches, by which the silicon substrate 1 is exposed. Then, as shown in FIG. 2D, on the gate oxide film 6 and the exposed silicon substrate 1, an $n^+$ doped polysilicon layer 7 is formed, which includes phosphorus with an impurity concentration of $1\times10^{16}$ $cm^{-3}$.

Figure 3A:
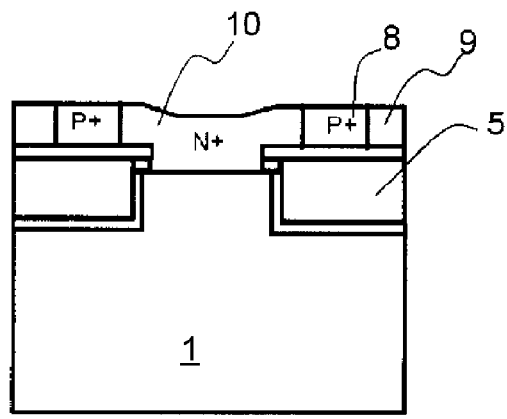
FIG. 3A schematically illustrates a cross sectional view showing the principal part of the semiconductor substrate at the manufacturing step next to the step shown in FIG. 2D at which a source region, a base region, and a buffer region are formed in the doped polysilicon layer.
Figure 3B:
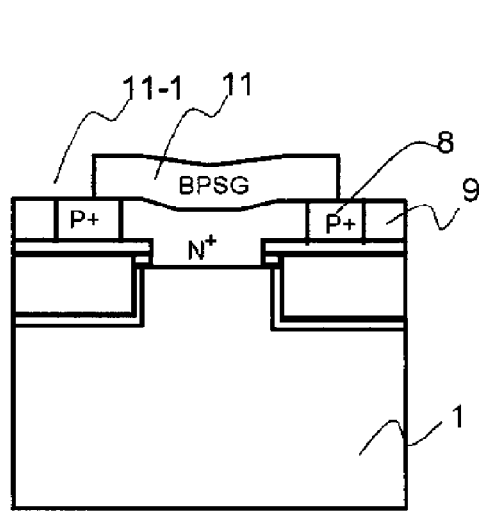
FIG. 3B schematically illustrates a cross sectional view showing the principal part of the semiconductor substrate at the manufacturing step next to the step shown in FIG. 3A at which a BPSG film as an interlayer insulator film is deposited and a contact hole is provided therein.
Figure 3C:
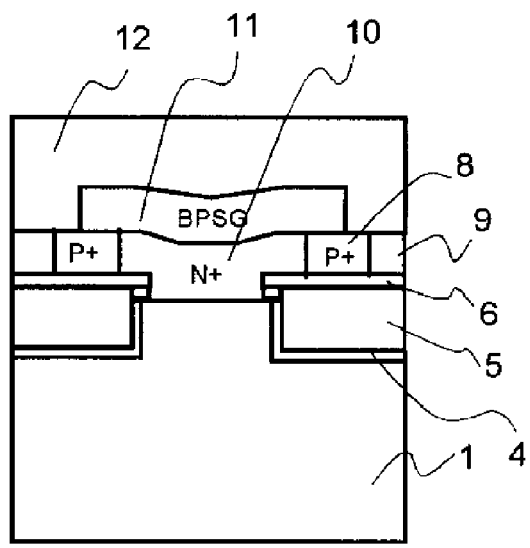
FIG. 3C schematically illustrates a cross sectional view showing the principal part of the semiconductor substrate at the manufacturing step next to the step shown in FIG. 3B at which an emitter electrode is formed to form a surface structure on the MOS gate side of an IGBT.
Figure 4A:
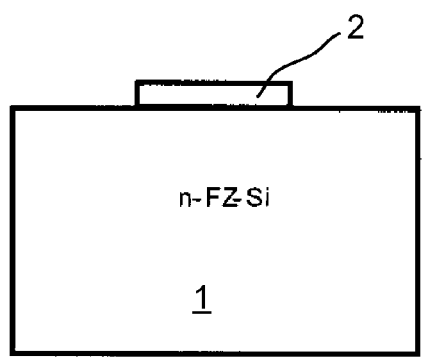
FIG. 4A schematically illustrates a cross sectional view showing the principal part of the semiconductor substrate at the manufacturing step at which a masking oxide film is formed on a silicon substrate in another manufacturing method of an IGBT according to the present invention.
Figure 4B:
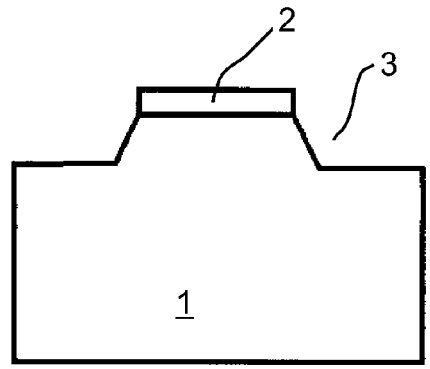
FIG. 4B schematically illustrates a cross sectional view showing the principal part of the semiconductor substrate at the manufacturing step next to the step shown in FIG. 4A at which a trench with a side wall angle smaller than 90° is formed in the substrate.
Figure 4C:
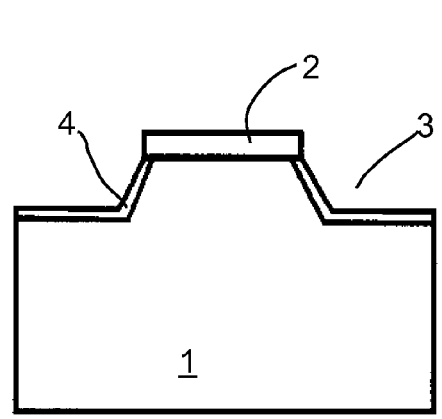
FIG. 4C schematically illustrates a cross sectional view showing the principal part of the semiconductor substrate at the manufacturing step next to the step shown in FIG. 4B at which a substrate oxide film is formed on the inner surface of the trench.
Figure 4D:
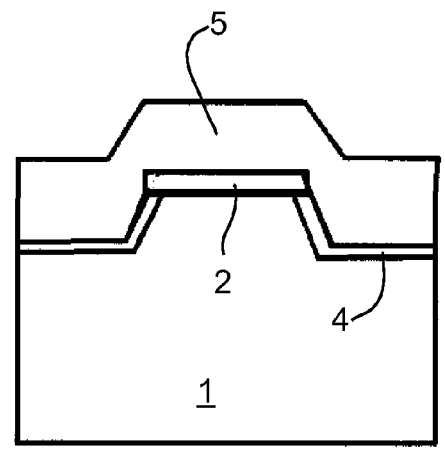
FIG. 4D schematically illustrates a cross sectional view showing the principal part of the semiconductor substrate at the manufacturing step next to the step shown in FIG. 4C at which a polysilicon layer is deposited to fill the trench.
Figure 5A:
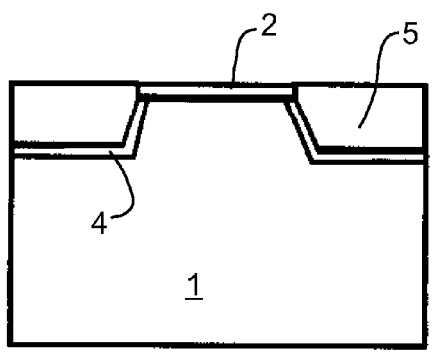
FIG. 5A schematically illustrates a cross sectional view showing the principal part of the semiconductor substrate at the manufacturing step next to the step shown in FIG. 4D at which the surface of the polysilicon layer is polished to be flat.
Figure 5B:
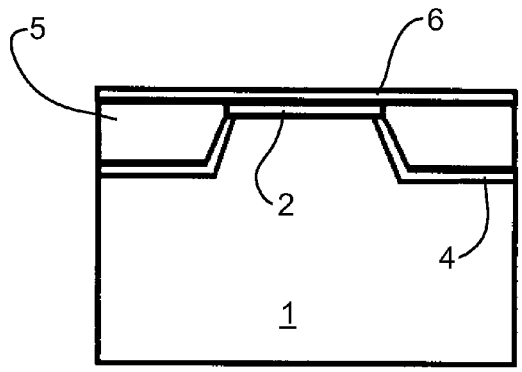
FIG. 5B schematically illustrates a cross sectional view showing the principal part of the semiconductor substrate at the manufacturing step next to the step shown in FIG. 5A at which a gate oxide film is formed on the surface of the masking oxide film and the polysilicon layer.
Figure 5C:
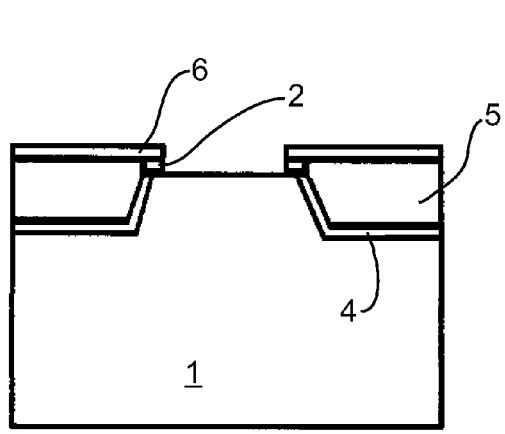
FIG. 5C schematically illustrates a cross sectional view showing the principal part of the semiconductor substrate at the manufacturing step next to the step shown in FIG. 5B at which ox1de films are partly removed to expose the silicon substrate.
Figure 5D:
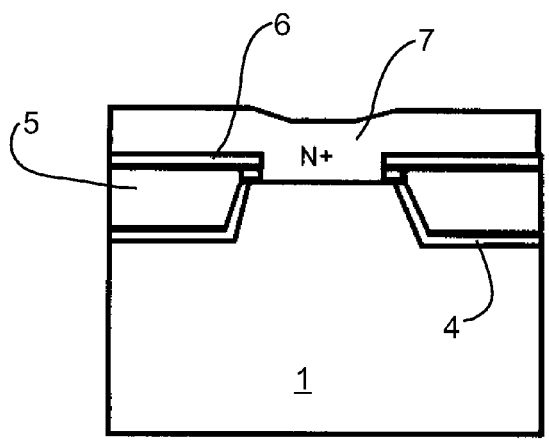
FIG. 5D schematically illustrates a cross sectional view showing the principal part of the semiconductor substrate at the manufacturing step next to the step shown in FIG. 5C at which a doped polysilicon layer is formed on the substrate.

In the polysilicon layer 7, as shown in FIG. 3A, an $n^{++}$-source region 9, a $p^+$-doped base region (or $p^+$-channel region) 8 and an $n^+$-buffer region 10 are formed. In the method of forming the regions, with a photoresist patterned in a shape of the $n^{++}$-source region 9 used as a mask, ion implantation is carried out with boron ions with a dose of $5\times10^{14}$ $cm^{-3}$. Moreover, with a photoresist patterned in a shape of the $p^+$-channel region 8 used as a mask, ion implantation is carried out with arsenic ions with a dose of $1\times10^{15}$ $cm^{-3}$. After the photoresists are subjected to ashing, driving diffusion is carried out, by which the $n^{++}$-source region 9 and the $p^+$-channel region 8 are formed. Furthermore, a region, in which the $n^+$-doped polysilicon layer 7 is left as it is, becomes the $n^+$-buffer region 10. Subsequently, as shown in FIG. 3B, a BPSG (Boron PhosphoSilicate Glass) film 11 as an interlayer insulator film is deposited to a thickness of 1 µm, in which a contact hole 11-1 is formed for an emitter electrode by carrying out patterning and etching. Thereafter, an Al emitter electrode (a cathode electrode) 12 is formed, by which a surface structure on the MOS gate side of the IGBT according to the present example is formed (FIG. 3C). The side of the other principal surface (the bottom surface) of the semiconductor substrate 1 can be ground as necessary. Moreover, in a $p^+$-collector region as a $p^+$-anode layer (not shown) formed on the side of the other principal surface (the bottom surface), an impurity concentration and a thickness can be selected as necessary by well-known technology. Further, in the $p^+$-collector region, an anode electrode (not shown) is formed so as to be in an ohmic contact with the $p^+$-collector region, by which a vertical IGBT is produced.

Next, the IGBT produced by the above method will be explained. In the embodiment of the IGBT shown in FIG. 3C, applying a voltage positive to the cathode (emitter) electrode 12, to the gate electrode (the gate polysilicon layer 5) causes a region of the $p^+$-base region 8 near the interface with the gate oxide film 6 to be inverted into the n-type to form a channel. In this state, a forward bias applied across the collector (not shown) and the emitter, i.e., across the anode and the cathode, causes electrons to flow into the drift layer (the $n^-$ single crystal silicon substrate 1) through the channel and an electron accumulation layer (a region along the gate oxide film 6 in the $n^+$-buffer region 10) to reach the $p^+$-anode layer (not illustrated) on the bottom surface of the substrate 1. This causes the p-n junction between the $p^+$-anode layer and the drift layer to be forward-biased to allow holes to be injected from the $p^+$-anode layer to the drift layer.

The injected holes, on arriving at the surface of the drift layer 1, enter the $n^+$-buffer region 10. Part of the holes entering the $n^+$-buffer region 10 disappears in the $n^+$-buffer region 10 by the recombination with electrons. The rest of the holes pass through the $n^+$-buffer region 10 to be collected into the $p^+$-base region 8. The hole current, flowing in the narrow and long polysilicon layer 7 as the layer in which the $n^+$-buffer region 10 and the $p^+$-base region are formed, causes a voltage drop. Therefore, an $n^+/n^-$ junction formed with the region along the gate oxide film 6 in the $n^+$-buffer region 10 as an electron accumulation layer and the $n^-$-drift layer 1 is forward-biased. This allows electrons to be injected into the $n^+$-buffer region 10 to enhance the electron concentration on the cathode side. According to the enhanced electron concentration, holes with the same concentration are accumulated for satisfying the charge neutrality condition.

Moreover, the holes, being injected into the $n^+$-buffer region 10, also make the $n^+/n^-$ junction further forward-biased, by which electrons are injected into the $n^+$-buffer region 10. The polysilicon layer 7 and the n-single crystal silicon substrate 1 are separated from each other by the substrate oxide film 4 in most of their parts except the surface of a protruded section in the cross section of the drift layer. Therefore, the p-n-p BJT region is a small part of the device and most part is a p-i-n diode region. Moreover, a channel can be formed over the most part of the area of the surface of the substrate to also allow the peripheral length of the channel to be freely increased. However, an excessively increased peripheral length results in excessively high transfer characteristics of the device that increase a limited current at short-circuit to lower short-circuit capability. Therefore, this must be taken into consideration in determining the peripheral length.

Next, an explanation will be made about an operation at blocking mode in which a forward bias is applied between the collector and the emitter with a gate potential made equal or negative to an emitter potential. In the blocking mode, a depletion layer expands from the p-n junction formed with the $p^+$-base region 8 and the $n^+$-buffer region 10. At the same time, a depletion layer also expands from the gate oxide film 6. This is because the $n^+$-buffer region 10 is biased in positive in contrast to the gate electrode whose electric potential is equal to or lower than the emitter potential. The $n^+$-buffer region 10, having a thickness only equal to the thickness of the polysilicon layer 7, is made completely depleted by a slight forward bias. With the total amount of the impurity in the $n^+$-buffer region 10 prepared at an amount equal to or lower than a certain one, the maximum electric field strength in the $n^+$-buffer region 10 can be restricted.

With the forward bias increased further, the depletion layer extends into the $n^-$-drift layer. Most of the applied forward bias is held by the $n^-$-drift layer. This can prevent generation of local peaks in the electric field strength in the $n^+$-buffer region 10 to hardly cause local avalanche breakdowns due to local electric field concentration. Thus, a sufficiently high forward breakdown voltage can be ensured. As a result, there is no degradation in the on-voltage to breakdown voltage tradeoff even though the forward breakdown voltage is increased. This is an excellent advantage over a related planar or trench IGBT. In the related planar or trench IGBT, it is difficult to avoid local electric field concentrations.

Polysilicon is inferior to single crystal silicon in terms of carrier mobility and a carrier lifetime. The carrier mobility and the carrier lifetime in polysilicon, however, are recovered to a large extent by annealing the polysilicon at high temperatures of 1000° C. or above. Technology has been developed to recover mobility while controlling crystal grain sizes by laser annealing. It is considered that the use of such technology can reduce variations in characteristics such as a threshold value of a gate voltage and transfer characteristics.

In the $n^{++}$-source region 9, in which the $n^+$-polysilicon layer 7 is made to have a high impurity concentration, a significantly high doping concentration provides low resistance despite low mobility of carriers, which therefore causes little voltage drop. Moreover, in the above example, since the peripheral length of the $p^+$-channel region (the $p^+$-base region 8), to which the $n^+$-polysilicon layer 7 is changed to be the p-type, can be comparatively freely determined by pattern design, by increasing the peripheral length so as to compensate for a voltage drop due to degradation in mobility, a voltage drop can be brought to the same degree as that of the related IGBT. Furthermore, in the $n^+$-buffer region 10, which is made up of the $n^+$-polysilicon layer 7, low mobility of carriers causes a slight increase in the voltage drop. The voltage drop, however, makes a small contribution to the total on-voltage. Conversely, a merit can be obtained in which the voltage drop in the $n^+$-buffer region 10 makes the electric potential of the $n^-$-drift layer 1 higher to the emitter potential.

The $n^+$-electron accumulation layer, made up of a region along the gate oxide film 6 and a region along the substrate oxide film 4 at the protruded section in the cross section of the $n^-$-drift layer 1, a significantly high electron concentration (around $1 \times 10^{19}$ cm$^{-3}$) and low electric resistance cause a small voltage drop. This makes the $n^+/n^-$ junction formed with the $n^+$-electron accumulation layer and the $n^-$-drift layer 1 further forward-biased, so that electrons are easily injected. Namely, the voltage drop in the $n^+$-buffer region 10 makes the carrier distribution in the $n^-$-drift layer in a surface-deviated shape, which is a large characteristic of the invention. This exhibits the advantage of the invention that optimizes the on-voltage to turn-on loss tradeoff. This means that the voltage drop in the n⁻-drift layer, occupying most of the on-voltage share particularly in a high breakdown voltage IGBT, is minimized to a certain turn-off loss.

A short lifetime and low mobility of carriers in the $n^+$-buffer region 10 shorten the diffusion length of holes as minority carriers to increase recombination of carriers in the $n^+$-buffer region 10. This results in a decrease in the hole current passing through the $p^+$-base region 8 and collected in the emitter electrode 12. Thus, the hole current contributing to latchup is made decreased to enhance latchup capability.

Here, a measure can be taken by which the physical properties of polysilicon in the polysilicon layer 7 are intentionally made not recovered. In this case, the diffusion length of the hole in the $n^+$-buffer region 10 becomes significantly shorter than the length of the $n^+$-buffer region 10. Thus, most of the holes disappear in the $n^+$-buffer region 10 by the recombination with electrons, so that no hole current reaches the $p^+$-base region 8. Thus enables realization of a latchup-free IGBT. The operation of such an IGBT is essentially different from that of a related IGBT. In this case, the $p^+$-base region 8 is not operated as a collector of a BJT. Thus, an equivalent circuit model of a related IGBT is not valid in which a MOSFET and a BJT are combined. An equivalent circuit of the IGBT such as above is expressed as a circuit in which a MOSFET and a p-i-n diode are combined.

The above structure of the IGBT has a design advantage of requiring no extreme miniaturization of the surface pattern. The cathode (emitter) contact region, as shown in FIG. 3C, is electrically isolated from the drift layer 1 by the substrate oxide film 4 except that the region is connected to the drift region 1 only at a section without the substrate oxide film 4, i.e., at the opening in the substrate oxide film 4. Thus, the design dimension of the cathode (emitter) contact region makes no direct contribution to the characteristics of the drift layer 1. This is in contrast to the related planar or trench IGBT. In the related IGBT, the entire cathode (emitter) region is directly connected to the drift region, so that its design dimension is directly related to the device characteristics. Therefore, the present example is characterized in that the characteristics of the tradeoff are unchanged without particular miniaturization of the $n^{++}$-source region 9.

FIG. 4A to FIG. 6C illustrate cross sectional views each showing a principal part of a semiconductor substrate at each of main manufacturing steps of another manufacturing method of an IGBT with a surface cathode side high injection structure. As shown in FIG. 4A to FIG. 6C, the manufacturing method in the second example differs from the manufacturing method described in the above example in that the side wall angle of a trench (an angle formed by the surface of a substrate and the side wall) formed in the step shown in FIG. 4B is smaller than 90°. In the second example, the side wall angle of the trench is desirably between 85 and 90°. By forming such shape, not only is the electric field concentration reduced at the corner of the bottom of the trench but also the width of a current path can be widely provided. Therefore, it is more difficult to form an electric field concentration, by which a conduction loss can be further reduced.

Etching conditions for forming a trench with a side wall inclined at such an angle were given as: the flow rate of $SF_6$=40 sccm, the flow rate of HBr=40 sccm, the flow rate of $O_2$=60 sccm, the pressure=3.3 Pa, the plasma source power=400 W, the bias power=40 W and the etching time=20 sec. Conditions other than that for the bias power are the same as those for the manufacturing method of the first example. The side wall angle of the trench can be freely controlled by changing the bias power. In the second example, the side wall angle of the trench of 87° was obtained with the bias power given as 40 W. However, the etching condition is not limited to the above on condition that the desired cross sectional shape is obtained. The side wall angle of the trench is desirably between 85 and 90°.

The polysilicon layer 7 in each of the above examples is explained as being made of polycrystalline silicon. The layer 7, however, can be made of single crystal silicon formed by an epitaxial growth.

FIG. 7A to FIG. 9B schematically illustrate cross sectional views each showing a principal part of a semiconductor substrate at each of main manufacturing steps of yet another method of an IGBT with a top gate type surface high injection structure to which lateral epitaxial growth is applied. The top gate type is known as a structure in which a gate electrode is disposed on the upper side of a gate oxide film and a channel region is formed on the lower side of the gate oxide film.

Figure 7A:
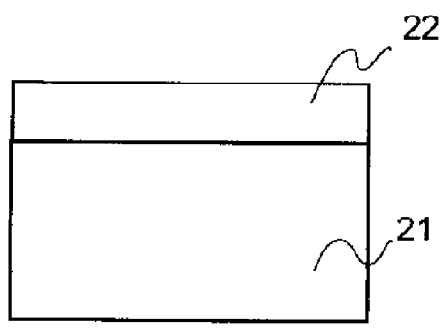
FIG. 7A schematically illustrates a cross sectional view showing the principal part of the semiconductor substrate at the manufacturing step at which an oxide film is formed on a silicon substrate in yet another manufacturing method of an IGBT according to the present invention.
Figure 7B:
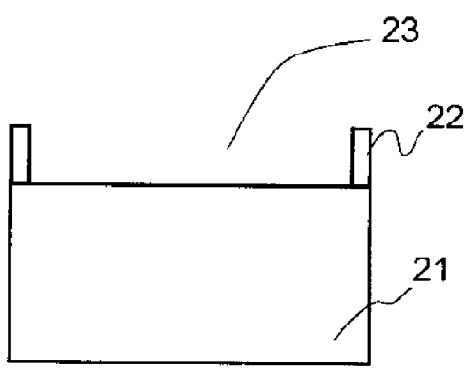
FIG. 7B schematically illustrates a cross sectional view showing the principal part of the semiconductor substrate at the manufacturing step next to the step shown in FIG. 7A at which an opening is provided in the oxide film.
Figure 7C:
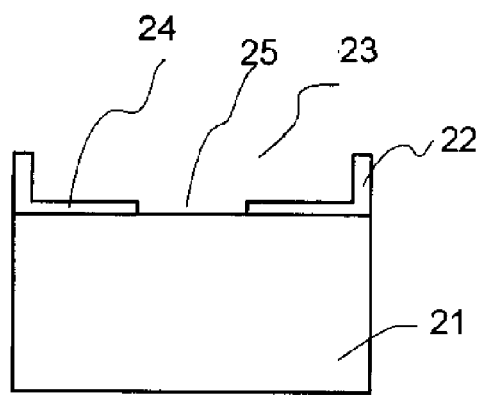
FIG. 7C schematically illustrates a cross sectional view showing the principal part of the semiconductor substrate at the manufacturing step next to the step shown in FIG. 7B at which a substrate oxide film is formed on the substrate to have an opening provided at the center.

As shown in FIG. 7A, an n-type FZ-silicon substrate 21 having a mirror polished surface is used as a substrate. The resistivity of the substrate is preferably within a range of 30 to 200 Ωcm, which is selected depending of the breakdown voltage of the IGBT. For example, manufacture by using a substrate with a resistivity of 80 Ωcm allows an IGBT with a breakdown voltage of 1200V to be provided. On the mirror polished surface of the substrate 21, an oxide film 22 with a film thickness of within the range of 0.3 μm to 1 μm is formed by thermal oxidation or CVD growth. Next, as shown in FIG. 7B, with a patterned photoresist provided on the oxide film 22, the oxide film 22 is subjected to dry etching to be selectively etched in a stripe-like form, by which a large opening 23 is formed. At this time, a cell pitch of 5 to 20 μm and the width of 0.5 to 2 μm of the stripe-like oxide film 22 are preferable. Here, the cell pitch and the width of the oxide film 22 were taken as 10 μm and 1 μm, respectively. Subsequently, as shown in FIG. 7C, a substrate oxide film 24 is formed on the entire surface of the substrate 21 by thermal oxidation or CVD growth. Thereafter, an opening 25 is provided at the center of the substrate oxide film 24 by photolithography. The oxide film 22 and the substrate oxide film 24 are formed in dish-like. The thickness of the oxide film 22, protruding at the end of the substrate 1 like the edge of the dish, is preferably within the range of 0.3 to 1 μm. The thickness of the substrate oxide film 24, forming the bottom of the dish, is preferably within the range of 0.05 to 0.2 μm. Here, the thickness of the oxide film 22 protruding at the end and the thickness of the substrate oxide film 24 forming the bottom were taken as 0.5 μm and 0.1 μm, respectively.

Figure 7D:
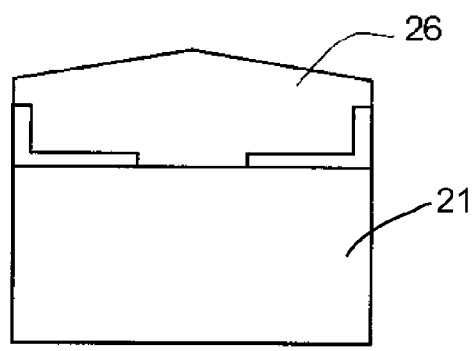
FIG. 7D schematically illustrates a cross sectional view showing the principal part of the semiconductor substrate at the manufacturing step next to the step shown in FIG. 7C at which a silicon epitaxial layer is made grown from the substrate to cover the entire surface.

Next, as shown in FIG. 7D, with the surface of the silicon substrate 21, exposed by providing the opening 25 in the substrate oxide film 24, used as a seed layer, an n-silicon epitaxial layer 26 is grown. A typical process gas used for this is a gas in which dichlorosilane or trichlorosilane is prepared as a main gas, hydrogen gas is prepared as a carrier gas, and arsine or phosphine is added as a doping gas. A reaction pressure is preferably 100 to 760 Torr (1 Torr=133.3 Pa) and a semiconductor substrate (wafer) temperature is preferably on the order of 1000° C. Here, with phosphine used as a doping gas, the conditions for the growth are controlled so that a concentration of phosphorus in the film becomes $1 \times 10^{16}$ cm$^{-3}$. When the surface of the grown n silicon epitaxial layer 26 becomes higher than the upper surface of the substrate oxide film 24, the growth proceeds also in the lateral direction. Thereafter, when the n-silicon epitaxial layer 26 goes over the oxide film 22, protruding at the end of the substrate 21, to cover the entire surface of the substrate 21, the supply of the process gas is made stopped to terminate the growth of the n-silicon epitaxial layer 26.

Next, the wafer 21 is carried into a CMP system to be polished with the oxide film 22 used as a stopper film until the surface of the n-silicon epitaxial layer (single crystal silicon layer) 26 becomes to have a flat cross sectional shape as shown in FIG. 8A. What is important at this time is to surely stop the polishing by the oxide film 22 taken as a reference oxide film (a stopper film) with a polishing selectivity (Si polishing rate/oxide film polishing rate) made increased as fifty times or more, preferably one hundred times or more. For this purpose, the high purity colloidal silica slurry planerlite-6103 made by Fujimi Inc., for example, is effectively used. Typical polishing conditions were given as 300 to 600 hP in top ring pressure and 50 to 100 rpm in number of table revolution. The polishing selectivity at this time is about 100 times. The polishing time can be made constant with polishing termination detection of some kind effectively carried out for preventing insufficient polishing (presence of a residue of the epitaxial layer left higher than the protruded oxide film) or excessive polishing (dishing) from being caused. Conceivable measures taken for this are detection of motor torque, reflected light measurement and the like. Here, motor torque detection was used for preventing faulty polishing so as to make the thickness of the n silicon epitaxial layer 26 approximately constant.

Subsequently, as shown in FIG. 8B, a gate oxide film 27 is formed over the entire surface by thermal oxidation or CVD. Here, as the gate oxide film 27, a thermal oxide film was formed with a thickness of 0.1 μm. Then, as shown in FIG. 8C, a polysilicon layer 28 to be a gate electrode was formed over the entire surface. Thereafter, as shown in FIG. 8D, the polysilicon film 28 is partially removed by photolithography. Next, with the left polysilicon layer 28 used as a mask, ion implantation is carried out with boron ions with a dose of $5 \times 10^{14}$ cm$^{-2}$ and arsenic ions with a dose of $1 \times 10^{15}$ cm$^2$. Then, driving diffusion of implanted ions is carried out at 1150° C. for two hours in an atmosphere of nitrogen, by which a p-channel region (p-base region) 29 and an n$^{++}$-source region 30 are formed in the n silicon epitaxial layer 26.

Figure 9A:
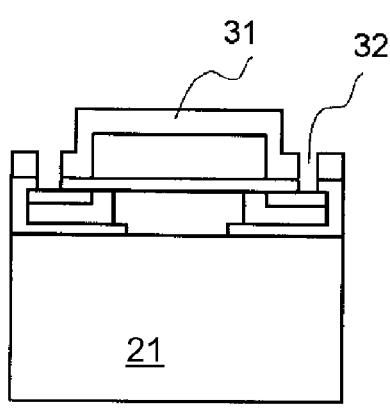
FIG. 9A schematically illustrates a cross sectional view showing the principal part of the semiconductor substrate at the manufacturing step next to the step shown in FIG. 8D at which a BPSG film as an interlayer insulator film is formed on the entire surface and an opening is provided therein for contact.
Figure 9B:
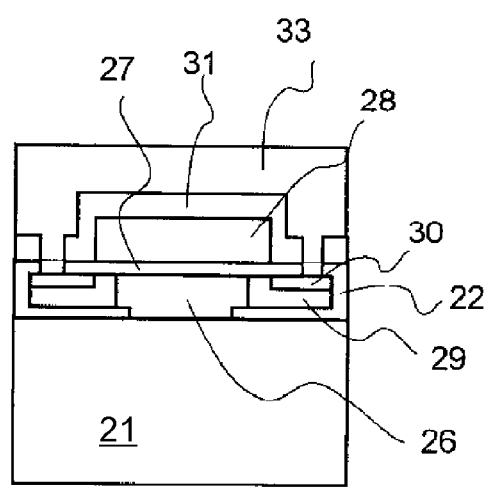
FIG. 9B schematically illustrates a cross sectional view showing the principal part of the semiconductor substrate at the manufacturing step next to the step shown in FIG. 9A at which an aluminum electrode is formed to form an IGBT by the method.

Thereafter, as shown in FIG. 9A, a BPSG film 31 with a thickness of about 1 μm is formed over the entire surface to be given as an interlayer insulator film. Subsequently, an opening 32 is provided for providing contact. Next, as shown in FIG. 9B, an aluminum electrode (an emitter electrode) 33 with a thickness of 5 μm is formed, by which the IGBT is completed.

The IGBT according to this third example has the following advantages:
1. The channel region 29 formed with the n-epitaxial layer 26 provides large carrier mobility, by which a resistance loss is reduced.
2. The channel region 29 formed with the epitaxial layer (single crystal layer) reduces leak current at forward blocking.
3. The CMP with the oxide film used as a stopper enables the epitaxial layer 26 to be a thin film and to be made uniform. This leads to improvement in breakdown voltage and reduction in variation in characteristics.

FIG. 10A to FIG. 12 illustrate cross sectional views showing yet another manufacturing method of an IGBT with a bottom gate type surface high injection structure to which lateral epitaxial growth is applied. The bottom gate type is known as a structure in which a polysilicon gate electrode is disposed on the lower side of a gate oxide film and a channel region (base region) is formed on the upper side of the gate oxide film. The fourth method differs from the third method in that the IGBT formed has the bottom gate structure and a nitride film is used as a stopper film. A cell pitch is, like in the third example, is desirably 5 to 20 μm. In the fourth example, the cell pitch was taken as 10 μm.

Figure 10A:
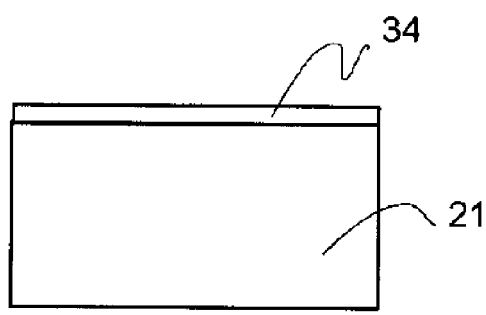
FIG. 10A schematically illustrates a cross sectional view showing a principal part of a semiconductor substrate at the manufacturing step at which a substrate oxide film is formed on a silicon substrate in yet another manufacturing method of an IGBT according to the present invention.
Figure 10B:
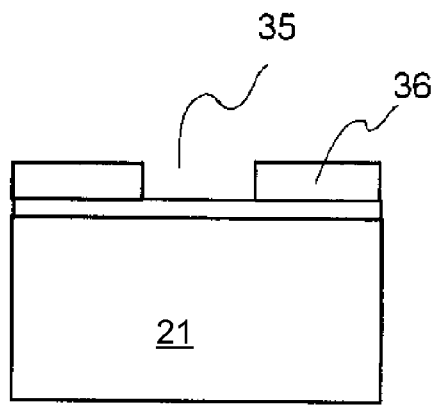
FIG. 10B schematically illustrates a cross sectional view showing the principal part of the semiconductor substrate at the manufacturing step next to the step shown in FIG. 10A at which on the substrate oxide film a polysilicon layer is deposited and an opening is provided therein.
Figure 10C:
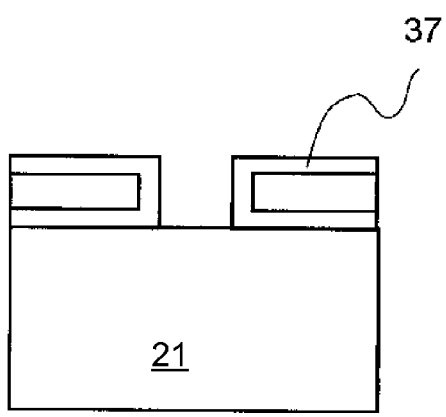
FIG. 10C schematically illustrates a cross sectional view showing the principal part of the semiconductor substrate at the manufacturing step next to the step shown in FIG. 10B at which a gate oxide film is formed on the polysilicon layer and the oxide film on a section without polysilicon layer is removed to partially expose the silicon substrate.
Figure 10D:
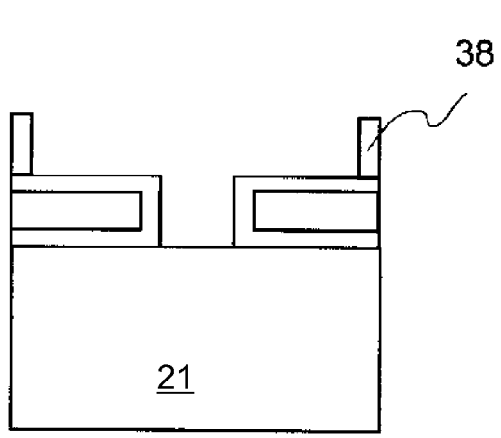
FIG. 10D schematically illustrates a cross sectional view showing the principal part of the semiconductor substrate at the manufacturing step next to the step shown in FIG. 10C at which a nitride film is formed over the entire surface before being etched into a stripe-like form with its end being left.
Figure 11A:
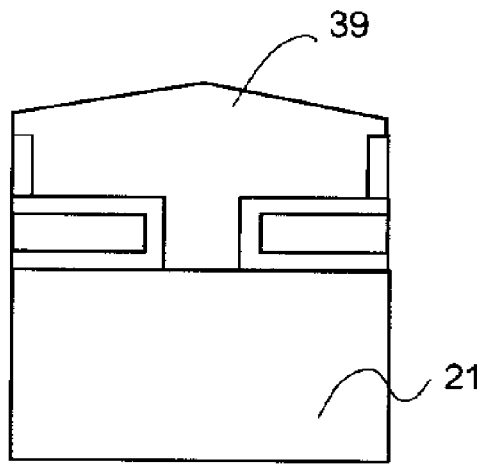
FIG. 11A schematically illustrates a cross sectional view showing the principal part of the semiconductor substrate at the manufacturing step next to the step shown in FIG. 10D at which a silicon epitaxial layer is made grown from the substrate to cover the entire surface.
Figure 11B:
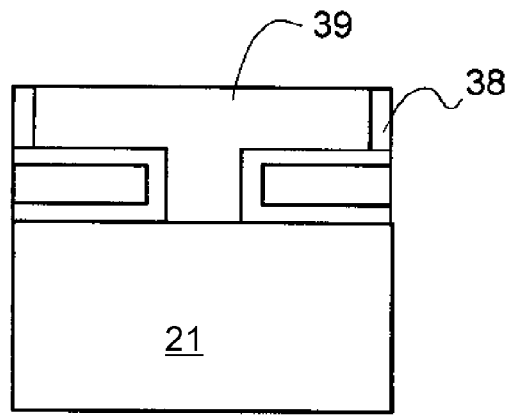
FIG. 11B schematically illustrates a cross sectional view showing the principal part of the semiconductor substrate at the manufacturing step next to the step shown in FIG. 11A at which the surface of the silicon epitaxial layer is polished to be flat.

In the fourth example, as shown in FIG. 10A, on an n-type FZ-silicon substrate 21 similar to that of the third example, a substrate oxide film 34 with a thickness of 0.1 μm is formed by thermal oxidation or CVD. On the substrate oxide film 34, as shown in FIG. 10B, a polysilicon layer 36 is deposited which is patterned to have an opening 35 provided. Then, as shown in FIG. 10C, an oxide film 37 with a film thickness of 0.1 μm is formed over the polysilicon layer 36 by thermal oxidation or CVD to be provided as a gate oxide film. The oxide film 37 formed on a section without the polysilicon layer 36 is then removed to partially expose the silicon substrate 21. Next, a nitride film with a film thickness of 0.5 μm is formed over the entire surface before being etched into a stripe-like form with a nitride film end 38 being left by the order of 0.5 to 2 μm as shown in FIG. 10D. Thereafter, as shown in FIG. 11A, with the surface of the exposed silicon substrate 21 used as a seed layer, a silicon epitaxial layer 39 is grown until the entire surface of the substrate 21 is coated with the n-silicon epitaxial layer 39. Then, as shown in FIG. 11B, with the nitride film end 38 used as a stopper, planarization of the silicon epitaxial layer 39 is carried out. The nitride film, having selectivity of the same degree as the degree of the selectivity of the oxide film, becomes an effective stopper. For example, in the case of grinding carried out under the same conditions as those in the third example with the use of the above-described high purity colloidal silica slurry planerlite-6103 made by Fujimi Inc., about one hundred times of selectivity can be obtained even with the use of a nitride film.

Figure 11C:
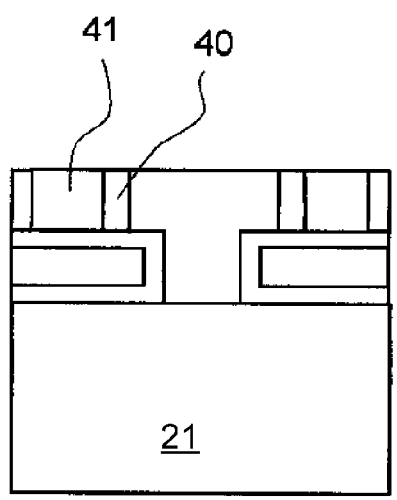
FIG. 11C schematically illustrates a cross sectional view showing the principal part of the semiconductor substrate at the manufacturing step next to the step shown in FIG. 11B at which a p-channel region and an $n^{++}$-source region are formed in the silicon epitaxial layer.
Figure 11D:
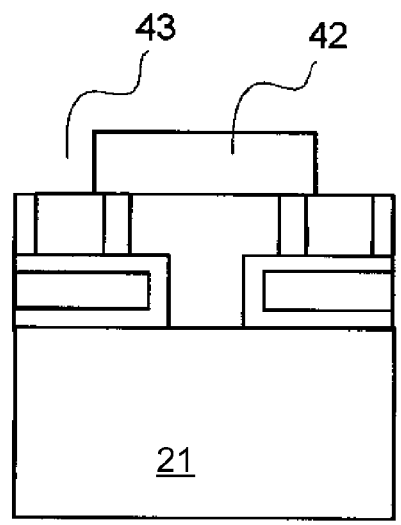
FIG. 11D schematically illustrates a cross sectional view showing the principal part of the semiconductor substrate at the manufacturing step next to the step shown in FIG. 11C at which a BPSG film as an interlayer insulator film is deposited on the entire surface and a contact hole is provided therein.
Figure 12:
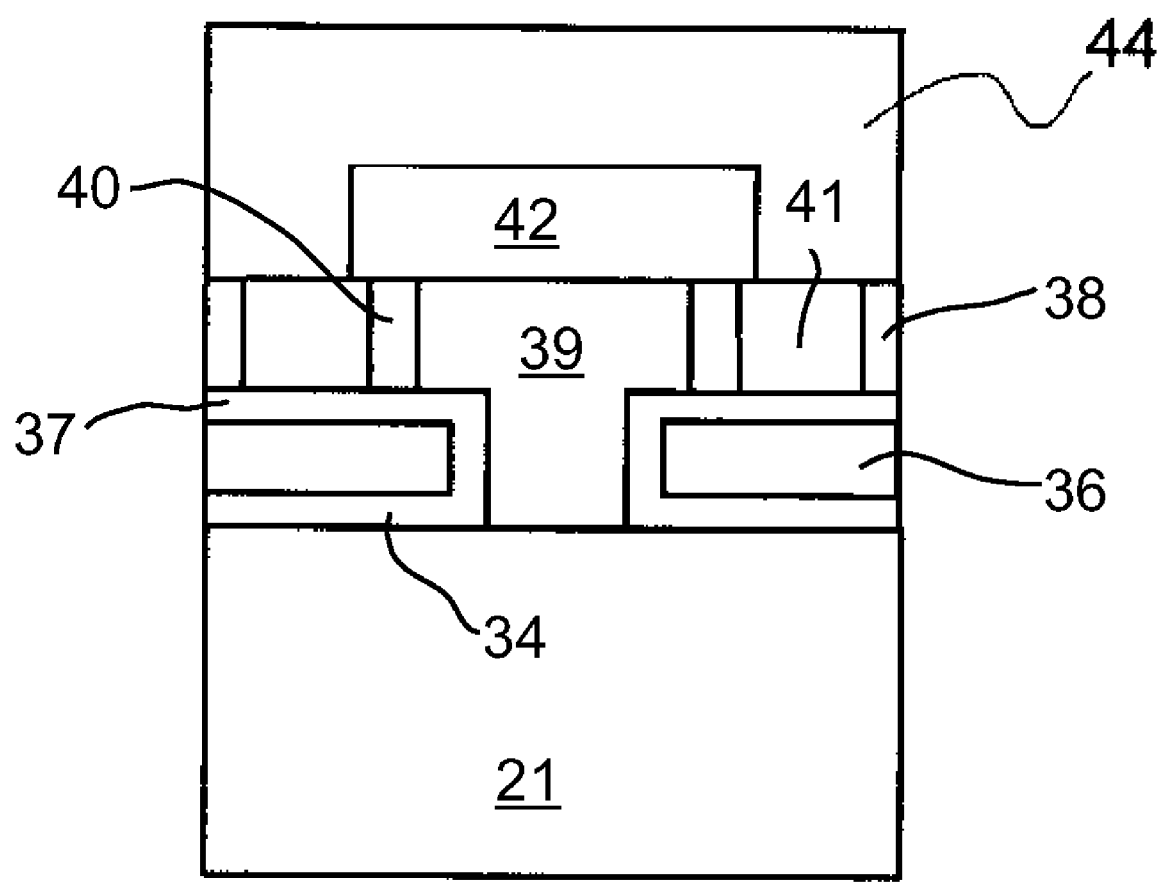
FIG. 12 schematically illustrates a cross sectional view showing the principal part of the semiconductor substrate at the manufacturing step next to the step shown in FIG. 11D at which an aluminum electrode is formed to form a surface structure on the MOS gate side of an IGBT.
Figure 13:
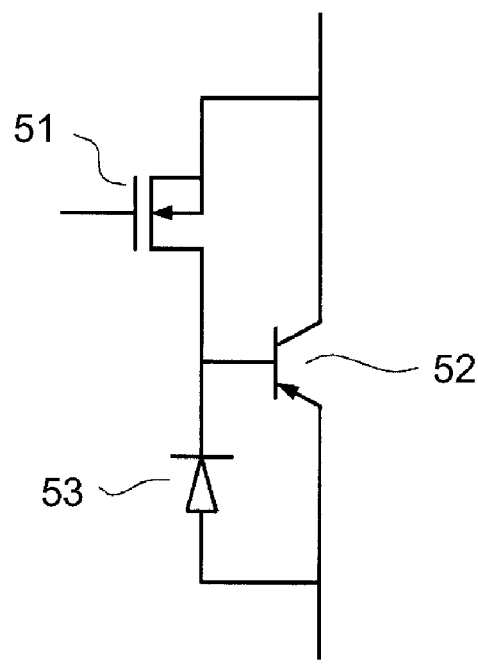
FIG. 13 is a diagram showing an equivalent circuit of an IGBT.
Figure 14:
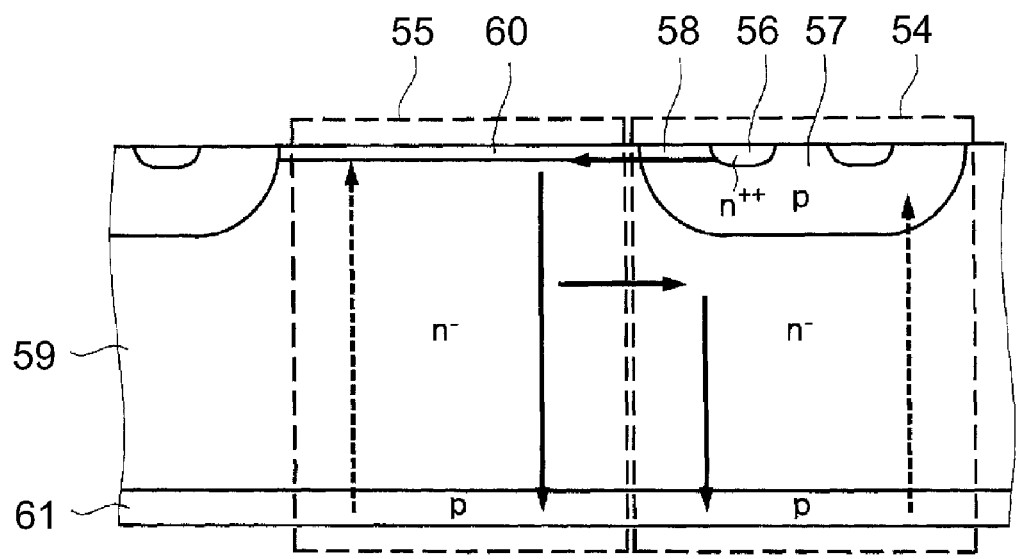
FIG. 14 schematically illustrates a cross sectional view showing an arrangement of a principal part of a planar IGBT.

Next, with a photoresist patterned in a shape of a p-channel region (p-base region) used as a mask, ion implantation is carried out with boron ions with a dose of $5 \times 10^{14}$ cm$^{-3}$. Moreover, with a photoresist patterned in a shape of an n$^{++}$-source region 41, used as a mask, ion implantation is carried out with arsenic ions with a dose of $1 \times 10^{15}$ cm$^{-3}$. After the photoresists are subjected to ashing, driving diffusion of implanted ions is carried out at 1150° C. for two hours in an atmosphere of nitrogen, by which the p-channel region (p-base region) 40 and the n$^{++}$-source region 41 are formed in the silicon epitaxial layer 39 as shown in FIG. 11C. Then, as shown in FIG. 11D, a BPSG film is deposited on the entire surface to a thickness of 1 μm to be formed as an interlayer insulator film 42 in which a contact hole 43 is formed by patterning. Next, as shown in FIG. 12, an aluminum electrode (an emitter electrode) 44 with a thickness of 5 μm is formed, by which a surface structure on the MOS gate side of the IGBT is formed. Advantages brought by the method are the same as those by the method according to the third example.

Furthermore, a manufacturing method can be provided in which the manufacturing methods according to the above examples are mixed. For example, a trench like the trench in the first example is formed, in which an n-polysilicon layer or an n-epitaxial silicon layer is formed over an insulator film formed on the bottom of the trench. After the surface of the n-polysilicon layer or the n-epitaxial silicon layer is made flush with the surface of the protruded section of the substrate, an n$^{++}$-source region, a p-base region (channel region) and an n$^+$-buffer region are formed. Then, a gate insulator film is formed on the surface. Thereafter, a polysilicon gate electrode, an interlayer insulator film provided with a contact hole for a source electrode and the source electrode are formed, by which a device can be also provided so that a top gate MOS gate structure is formed. Moreover, a method can be provided by which, in the above-described trench, a polysilicon gate electrode with an insulator film put between the bottom of the trench and the polysilicon gate electrode is formed, a gate insulator film is formed on the surface of the polysilicon gate electrode, and an n-polysilicon layer or an n-epitaxial silicon layer is formed on and in contact with the gate insulator film. After the surface of the n-polysilicon layer or the n-epitaxial silicon layer is made flush with the surface of the protruded section of the substrate, an n$^{++}$-source region, a p-base region (channel region) and an n$^+$-buffer region are formed, on which an interlayer insulator film and a source electrode are formed. With such a method, a bottom gate MOS gate structure can be also formed.

A semiconductor device and a method of manufacturing the same according to the present invention can improve the tradeoff between the on-voltage and the turned-off loss by increasing the amount of electrons injected from a cathode on a surface to increase the amount of carriers on the cathode side in a stable turned-on state of the device for enhancing the IE effect.

While the present invention has been particularly shown and described with reference to preferred embodiments thereof, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, Japanese Application Nos. 2005-185877, filed on 27 Jun. 2005, and 2004-256251, filed on 2 Sep. 2004. The disclosures of the priority applications, in their entirety, including the drawings, claims, and the specification thereof, are incorporated herein by reference.

What is claimed is:

1. A method of manufacturing a semiconductor device having a MOS gate side surface structure, the method including the steps of:

forming a masking insulator film on the surface of a semiconductor substrate of one conductivity type;

forming a trench in the semiconductor substrate using the masking insulator film as a mask;

forming a substrate insulator film on the surface of the semiconductor substrate, including the trench;

depositing a polycrystalline semiconductor layer to a thickness more than the depth of the trench;

smoothing the surface of the polycrystalline semiconductor layer by grinding the surface of the polycrystalline semiconductor layer until the surface of one of the masking insulator film or the substrate insulator film becomes exposed;

forming a gate insulator film on the surface of the semiconductor substrate;

removing all insulator films layered at the position of the masking insulator film to expose the surface of the semiconductor substrate;

depositing a semiconductor layer of the one conductivity type on the exposed semiconductor substrate and the gate insulator film so that the semiconductor layer contacts the surface of the exposed semiconductor substrate;

forming a base region of the other conductivity type and an emitter region of the one conductivity type in the deposited semiconductor layer, the base region being formed adjacent to a region of the deposited semiconductor layer in contact with the semiconductor substrate, the region being provided as a buffer region of the one conductivity type, and the emitter region being formed adjacent to the base region on the side opposite to the buffer region; and forming an emitter electrode covering the buffer region with an interlayer insulator film between and in contact with both the base region of the other conductivity type and the emitter region.

2. The method of manufacturing a semiconductor device as claimed in claim 1, wherein the buffer region is formed with an impurity concentration higher than that of the semiconductor substrate.

3. The method of manufacturing a semiconductor device as claimed in claim 1, wherein the deposited semiconductor layer is a single crystal or polycrystalline semiconductor layer of the one conductivity type.

4. The method of manufacturing a semiconductor device as claimed in claim 1, wherein the trench has a side wall forming an angle of 90° or less with the surface of the semiconductor substrate.

* * * * *